(12) United States Patent
Tseng

(10) Patent No.: US 7,924,552 B2
(45) Date of Patent: Apr. 12, 2011

(54) PORTABLE ELECTRONIC DEVICE WITH AN IMPACT-PROTECTION FUNCTION

(75) Inventor: Tien-Chung Tseng, Taipei Hsien (TW)

(73) Assignee: Wistron Corporation, Xizhi Dist., New Taipei (TW)

( * ) Notice: Subject to any disclaimer, the term of this patent is extended or adjusted under 35 U.S.C. 154(b) by 217 days.

(21) Appl. No.: 12/432,769

(22) Filed: Apr. 30, 2009

(65) Prior Publication Data
US 2010/0157515 A1    Jun. 24, 2010

(30) Foreign Application Priority Data

Dec. 19, 2008   (TW) ............................. 97149665 A

(51) Int. Cl.
*G06F 1/16*    (2006.01)
(52) U.S. Cl. .................. 361/679.02; 280/252; 428/346; 701/36

(58) Field of Classification Search ............... 280/728.1, 280/731, 252, 743.1, 729, 735; 205/205; 361/679.02, 679.26, 679.34, 679.55; 428/425.5, 428/425.6, 136, 346, 212, 141; 473/49; 602/3, 602/41; 701/22, 29, 45, 30, 36, 70
See application file for complete search history.

(56) References Cited

U.S. PATENT DOCUMENTS

| | | | |
|---|---|---|---|
| 6,575,494 B1* | 6/2003 | Heilig et al. | 280/728.1 |
| 6,637,770 B2* | 10/2003 | Helmstetter | 280/731 |
| 2008/0060946 A1* | 3/2008 | Heil et al. | 205/205 |

* cited by examiner

*Primary Examiner* — Hung V Duong
(74) *Attorney, Agent, or Firm* — Winston Hsu; Scott Margo

(57) ABSTRACT

A portable electronic device includes a housing, a gasbag module installed on the housing in an expansible manner, and a pressure module connected to the gasbag module for conducting air outside the gasbag module into the gasbag module so as to expand the gasbag module.

15 Claims, 11 Drawing Sheets

PORTABLE ELECTRONIC DEVICE WITH AN IMPACT-PROTECTION FUNCTION

BACKGROUND OF THE INVENTION

1. Field of the Invention

The present invention relates to a portable electronic device with an impact-protection function, and more particularly, to a portable electronic device utilizing an expansible gasbag module to provide an impact-protection function.

2. Description of the Prior Art

In highly developed information communication systems in the modern information society, electronic devices are widely utilized in every area. For instance, the utilization of a convenient and lightweight mobile phone, a personal digital assistant (PDA), and an industrial PDA have become a way of communication in our daily life. In regard to the impact protection or drop protection of portable electronic products, most drop test standards follow real usage scenarios for the products to be tested. The drop might cause damage of the portable electronic products without an effective impact-protection mechanism. For example, it is easy to damage the hard disk because of crashing a magnetic head of the hard disk, such as falling down ground, when the hard disk is reading or writing data so that the stored data get lost. There is a need to design an effective impact-protection mechanism for preventing damage of the portable electronic products due to drop.

SUMMARY OF THE INVENTION

According to the claimed invention, a portable electronic device includes a housing, a gasbag module installed on the housing in an expansible manner, and a pressure module connected to the gasbag module for conducting air outside the gasbag module into the gasbag module so as to expand the gasbag module.

According to the claimed invention, the housing includes a front casing, and a back casing combined with the front casing.

According to the claimed invention, the gasbag module includes a first gasbag installed on the front casing, and a second gasbag connected to the first gasbag and installed on the back casing.

According to the claimed invention, the first gasbag and the second gasbag are disposed around the front casing and the back casing respectively.

According to the claimed invention, the gasbag module is disposed around the housing.

According to the claimed invention, a first chamber and a second chamber are formed inside the pressure module, the first chamber is for connecting the outside of the gasbag module, and the second chamber is for connecting the inside of the gasbag module.

According to the claimed invention, the pressure module includes a first valve disposed on a side of the first chamber for controlling inhalation of the air outside the gasbag module into the first chamber, a second valve disposed between the first chamber and the second chamber for controlling inhalation of air inside the first chamber into the second chamber, and a third valve disposed on a side of the second chamber for controlling exhaustion of the air inside the second chamber out of the gasbag module.

According to the claimed invention, the pressure module further comprises a driving component disposed on a side of the first chamber for changing volume of the first chamber so as to drive the air inside the first chamber to the inside of the gasbag module via the second valve and the second chamber.

According to the claimed invention, the air inside the first chamber pushes the second valve so as to flow into the inside of the gasbag module via the second chamber when the driving component is pressed.

According to the claimed invention, the first valve is close for stopping the air outside the gasbag module from flowing into the first chamber when the driving component is pressed.

According to the claimed invention, the first valve is open for allowing the air outside the gasbag module for flowing into the first chamber when the driving component recovers from a pressed condition.

According to the claimed invention, the driving component is a button.

According to the claimed invention, the driving component is a piston.

According to the claimed invention, air inside the gasbag module flows outside the gasbag module via the second chamber when the third valve is pressed to open.

According to the claimed invention, the gasbag module is made of silica gel material.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
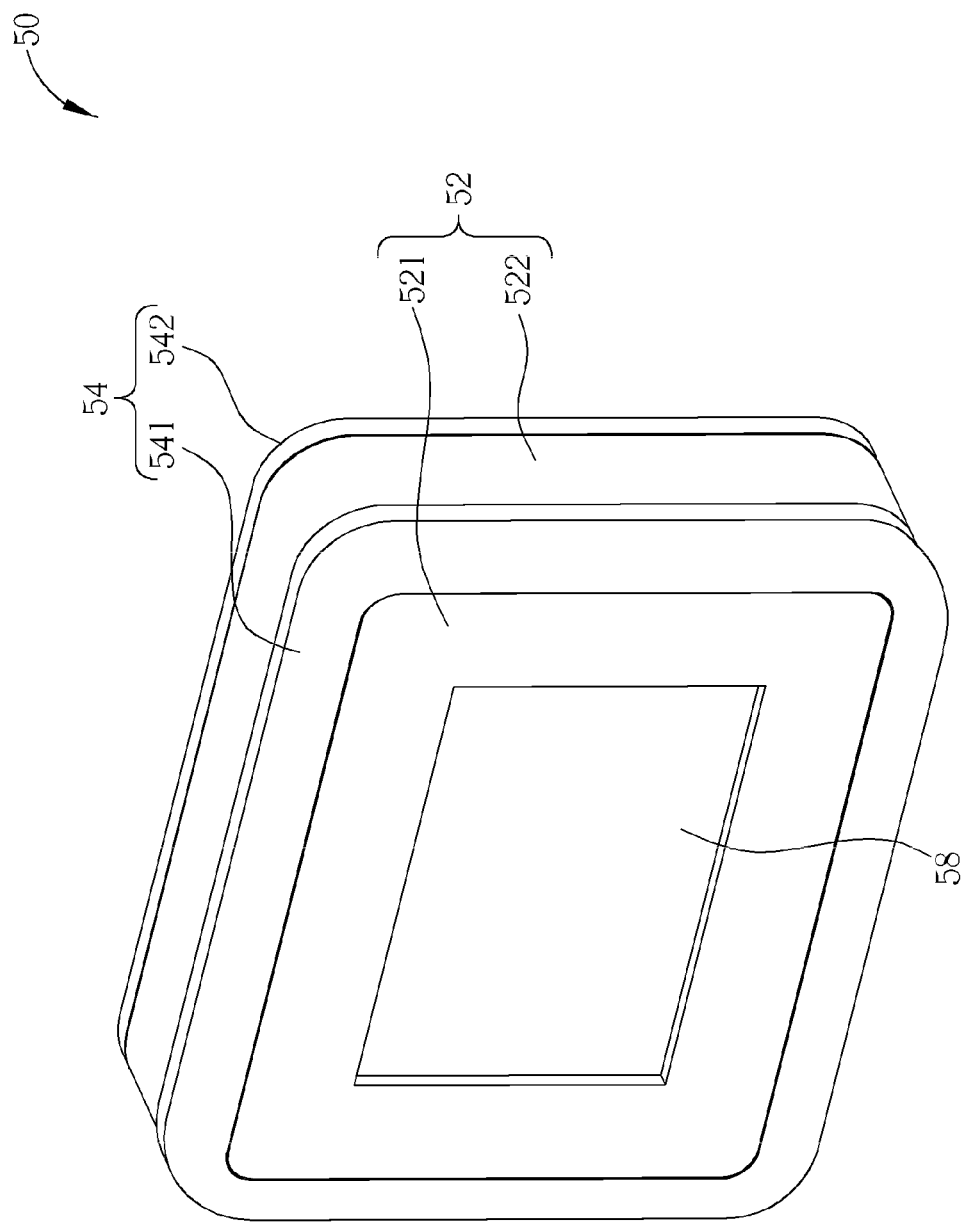
FIG. 1 and FIG. 2 are perspective drawings of a portable electronic device which has not actuated an impact-protection function according to a preferred embodiment of the present invention.
Figure 2:
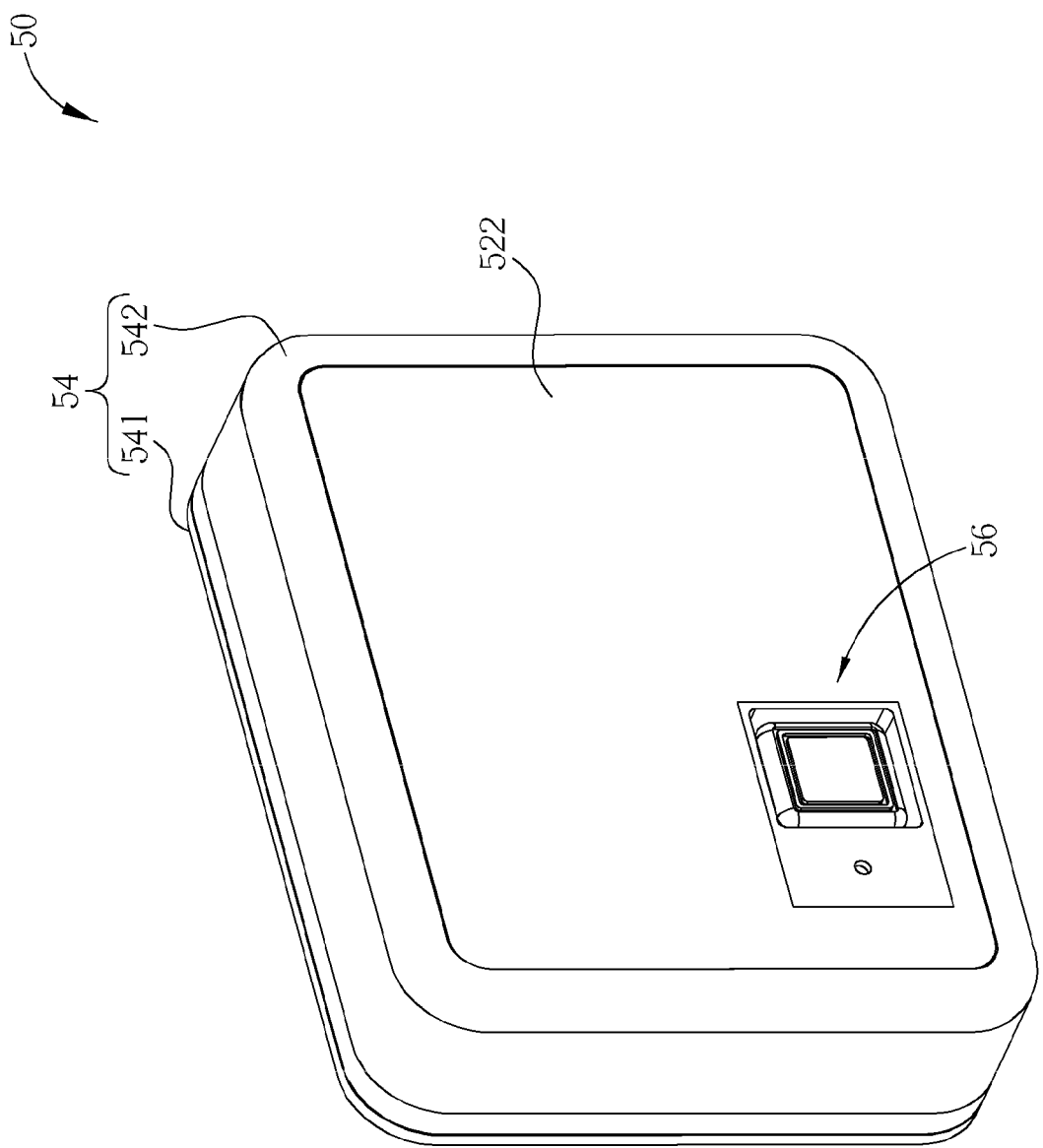
Figure 3:
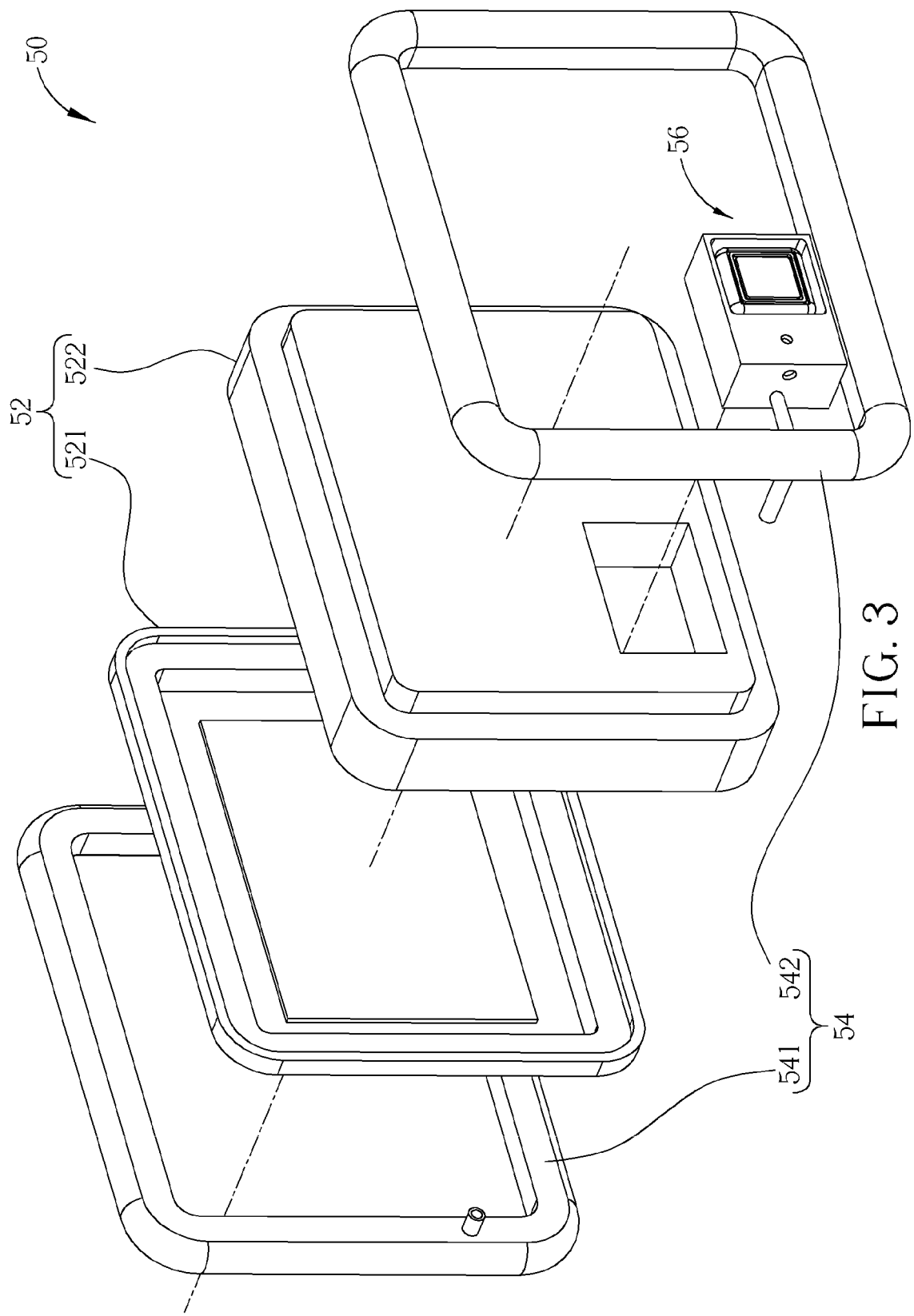
FIG. 3 is an exploded drawing of the portable electronic device according to the preferred embodiment of the present invention.
Figure 4:
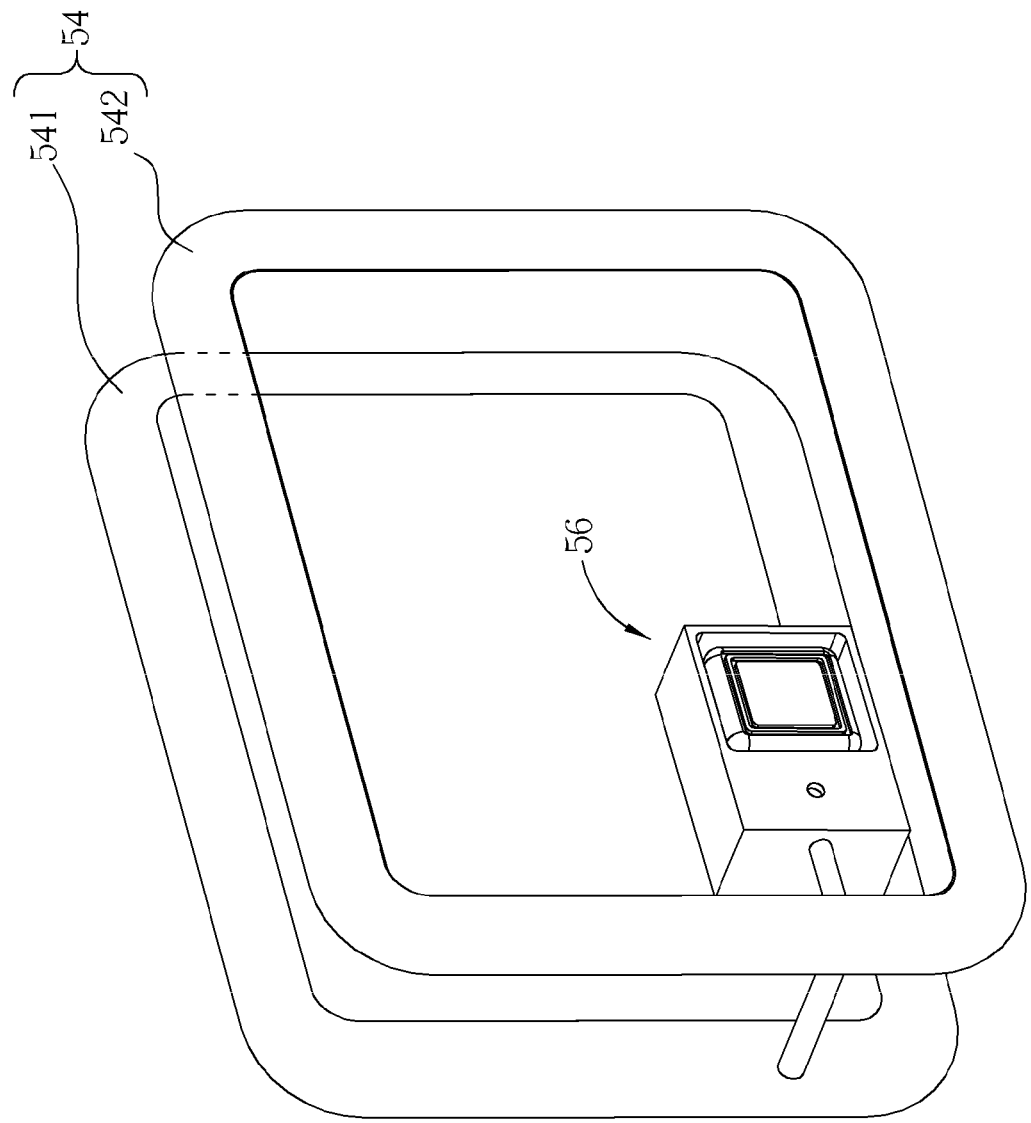
FIG. 4 is a diagram of a gasbag module and a pressure module according to the preferred embodiment of the present invention.

Please refer to FIG. 1 to FIG. 3. FIG. 1 and FIG. 2 are perspective drawings of a portable electronic device 50 which has not actuated an impact-protection function according to a preferred embodiment of the present invention. FIG. 3 is an exploded drawing of the portable electronic device 50 according to the preferred embodiment of the present invention. The portable electronic device 50 can be a mobile phone, a personal digital assistant (PDA), an industrial PDA, and so on. The portable electronic device 50 includes a housing 52 having a front casing 521 and a back casing 522 combined with the front casing 521. The portable electronic device 50 further includes a gasbag module 54 installed on the housing 52 in an expansible manner. In this embodiment, the gasbag module 54 includes a first gasbag 541 installed on the front casing 521, and a second gasbag 542 connected to the first gasbag 541 and installed on the back casing 522. The first gasbag 541 and the second gasbag 542 can be disposed around the front casing 521 and the back casing 522 respectively. The amount and the disposition of the gasbags of the gasbag module 54 are not limited to this embodiment and depend on actual demand. The gasbag module 54 can be made of flexible material, such as rubber or silica gel material for expansion and contraction. The portable electronic device 50 further includes a pressure module 56 connected to the gasbag module 54. Please refer to FIG. 3 and FIG. 4. FIG. 4 is a diagram of the gasbag module 54 and the pressure module 56 according to the preferred embodiment of the present invention. The pressure module 56 is capable of conducting air outside the gasbag module 54 into the gasbag module 54 so as to expand the gasbag module 54. In this embodiment, the pressure module 56 is disposed on the backing casing 522 of the housing 52 so as to maintain aesthetic feeling and to prevent interference with other components. For instance, a display screen 58 can be disposed on the front casing 521 of the housing 52, and the pressure module 56 is disposed on the back casing 522 of the housing 52. The disposition of the pressure module 56 is not limited to this embodiment and depends on actual demand.

Figure 5:
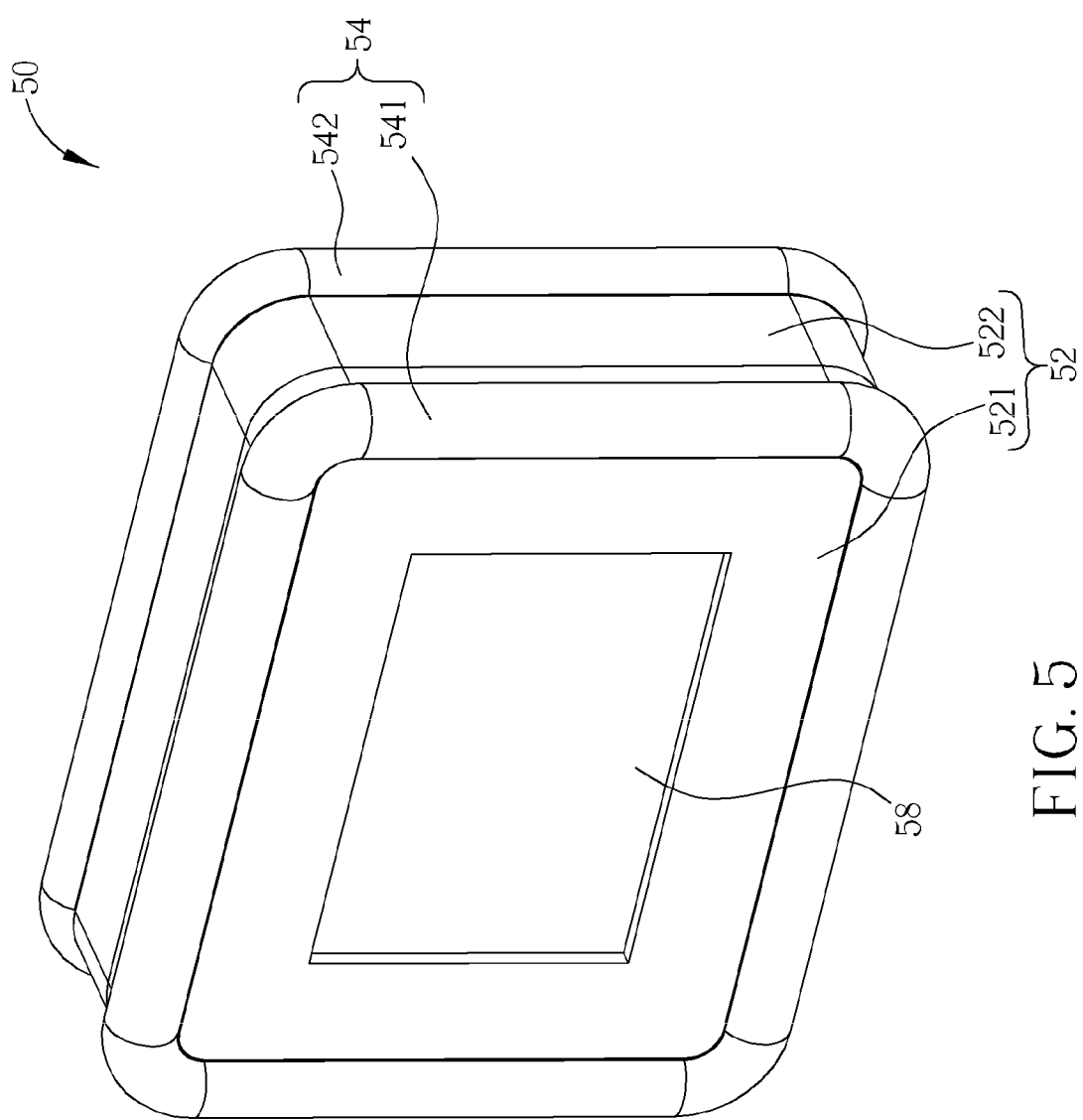
FIG. 5 is a perspective drawing of the portable electronic device which has actuated the impact-protection function according to the preferred embodiment of the present invention.
Figure 6:
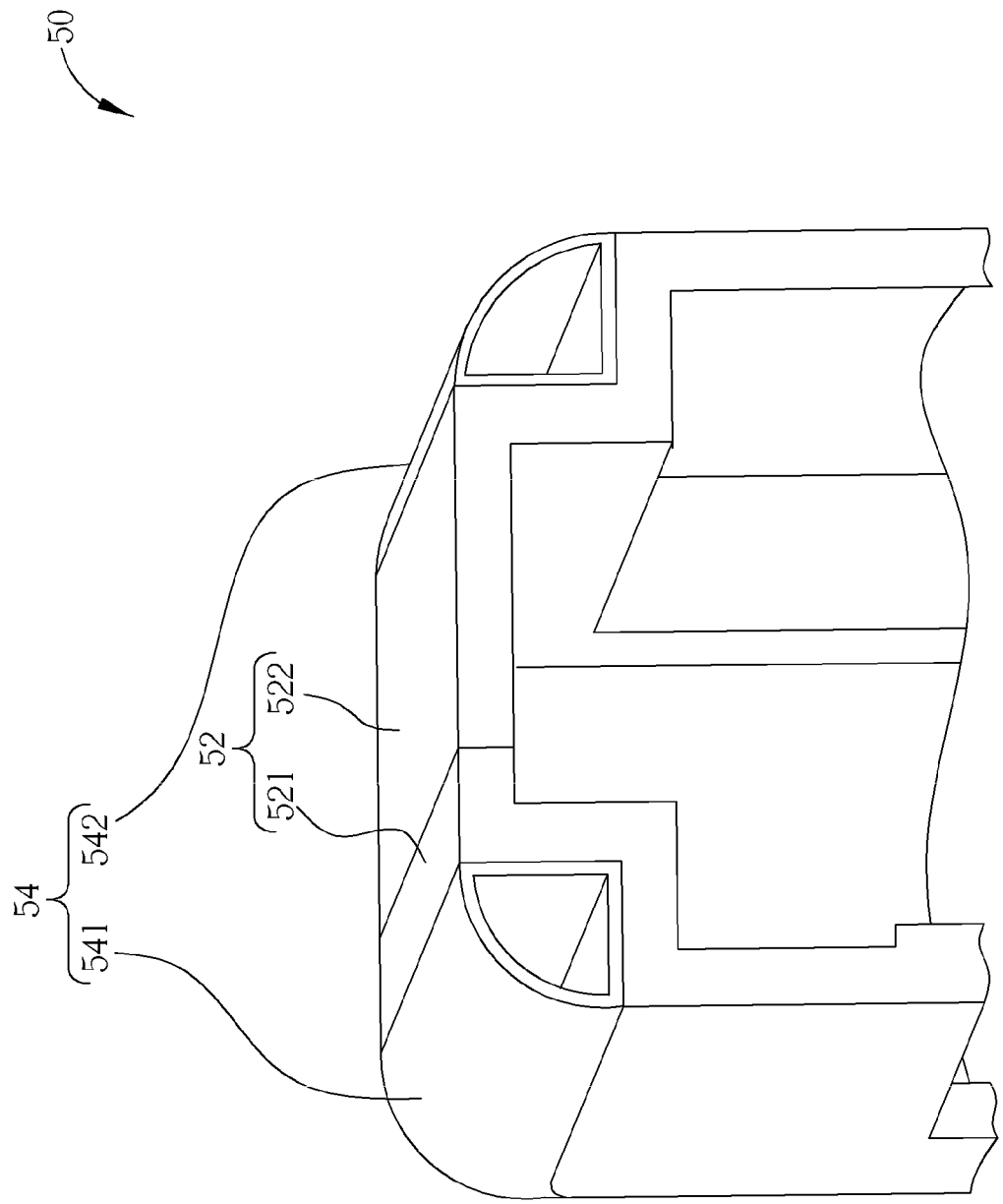
FIG. 6 is a sectional view of the portable electronic device which has not actuated the impact-protection function according to the preferred embodiment of the present invention.
Figure 7:
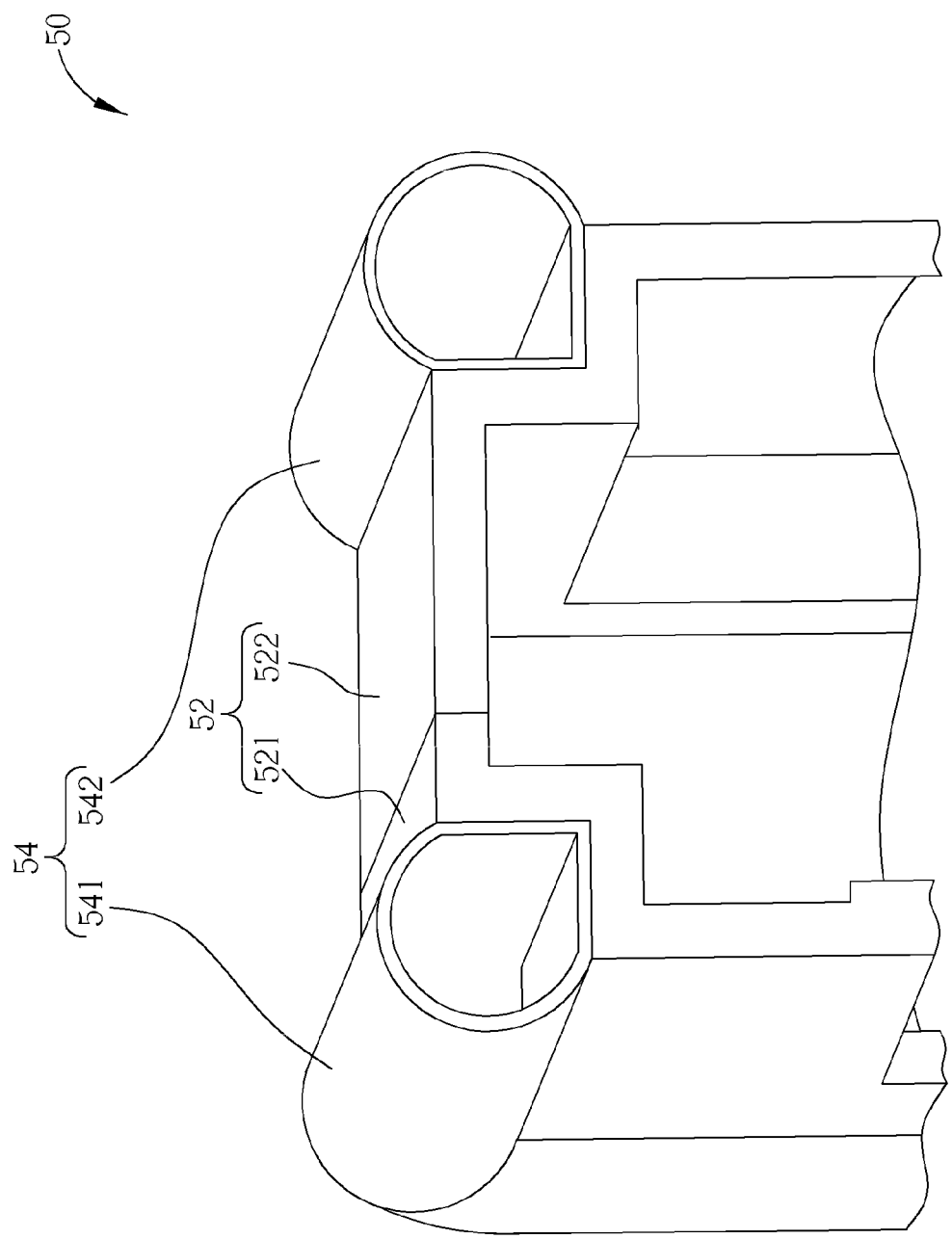
FIG. 7 is a sectional view of the portable electronic device which has actuated the impact-protection function according to the preferred embodiment of the present invention.

Please refer to FIG. 5 to FIG. 7. FIG. 5 is a perspective drawing of the portable electronic device 50 which has actuated the impact-protection function according to the preferred embodiment of the present invention. FIG. 6 is a sectional view of the portable electronic device 50 which has not actuated the impact-protection function according to the preferred embodiment of the present invention. FIG. 7 is a sectional view of the portable electronic device 50 which has actuated the impact-protection function according to the preferred embodiment of the present invention. When the pressure module 56 conducts the air outside the gasbag module 54 into the gasbag module 54 for expanding the gasbag module 54, the gasbag module 54 protrudes from the housing 52 for preventing the housing 52 from crashing when the portable electronic device 50 drops so as to provide the impact-protection function.

Figure 8:
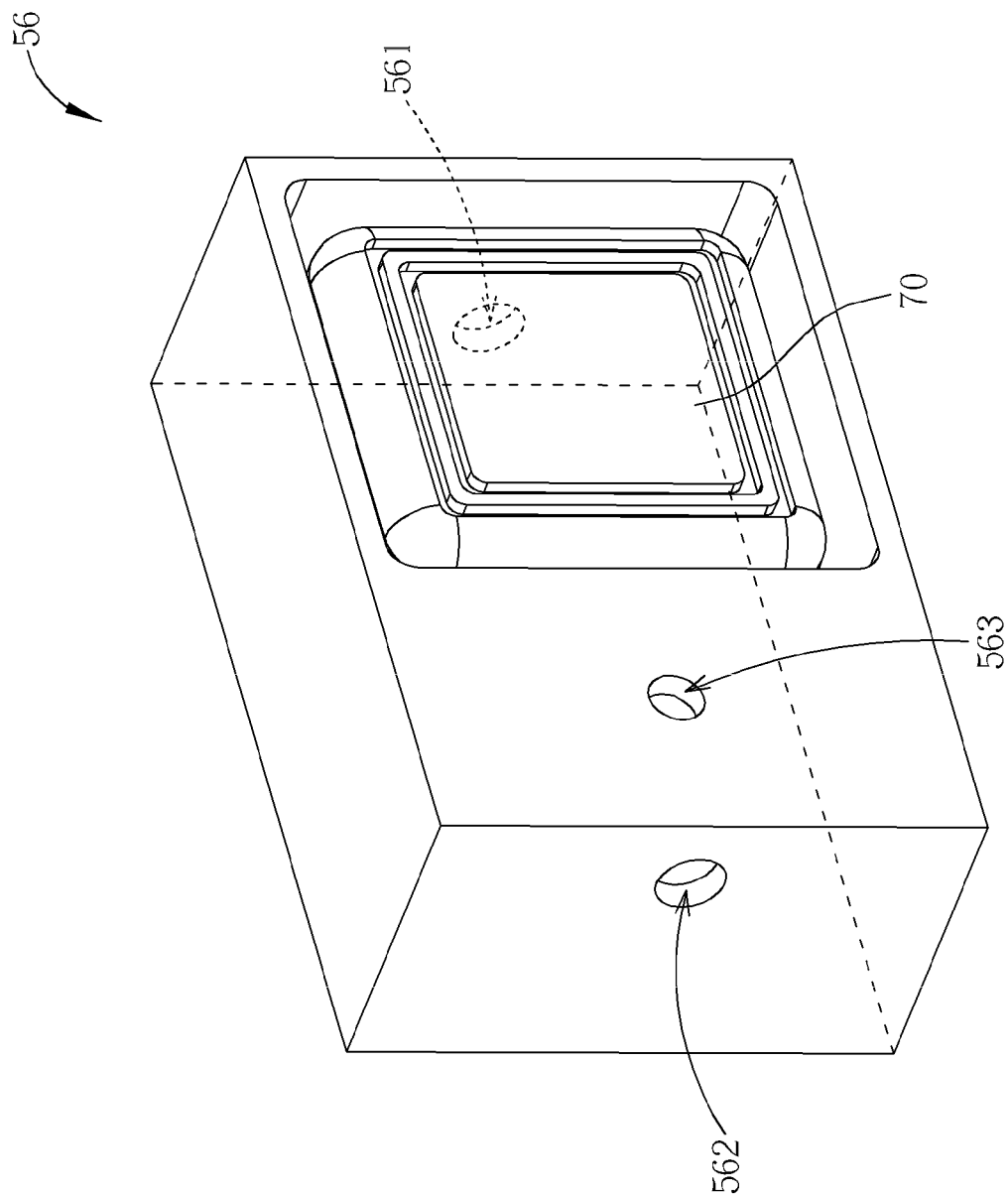
FIG. 8 is a diagram of the pressure module according to the preferred embodiment of the present invention.
Figure 9:
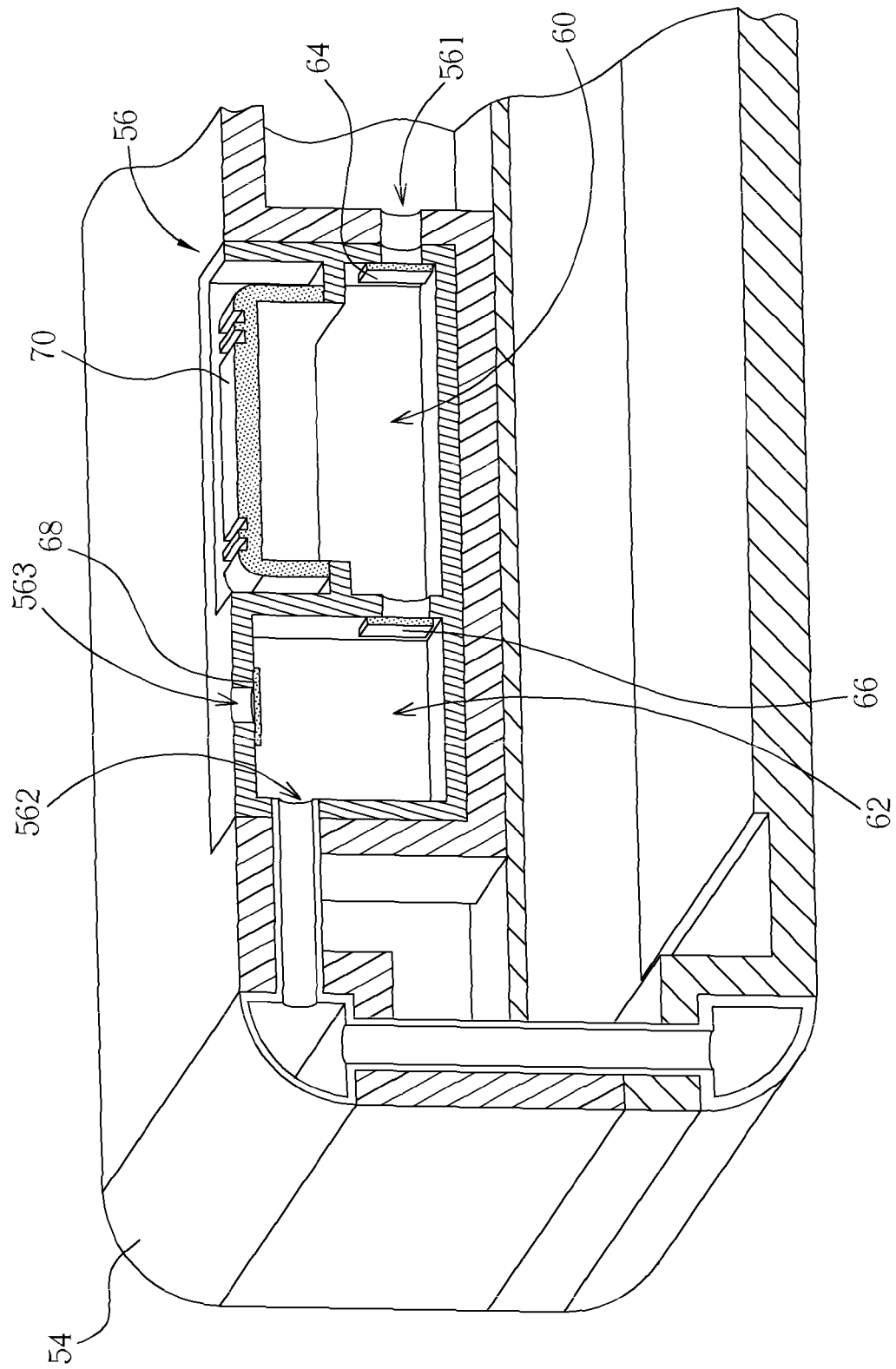
FIG. 9 is a sectional view of the gasbag module and the pressure module according to the preferred embodiment of the present invention.
Figure 10:
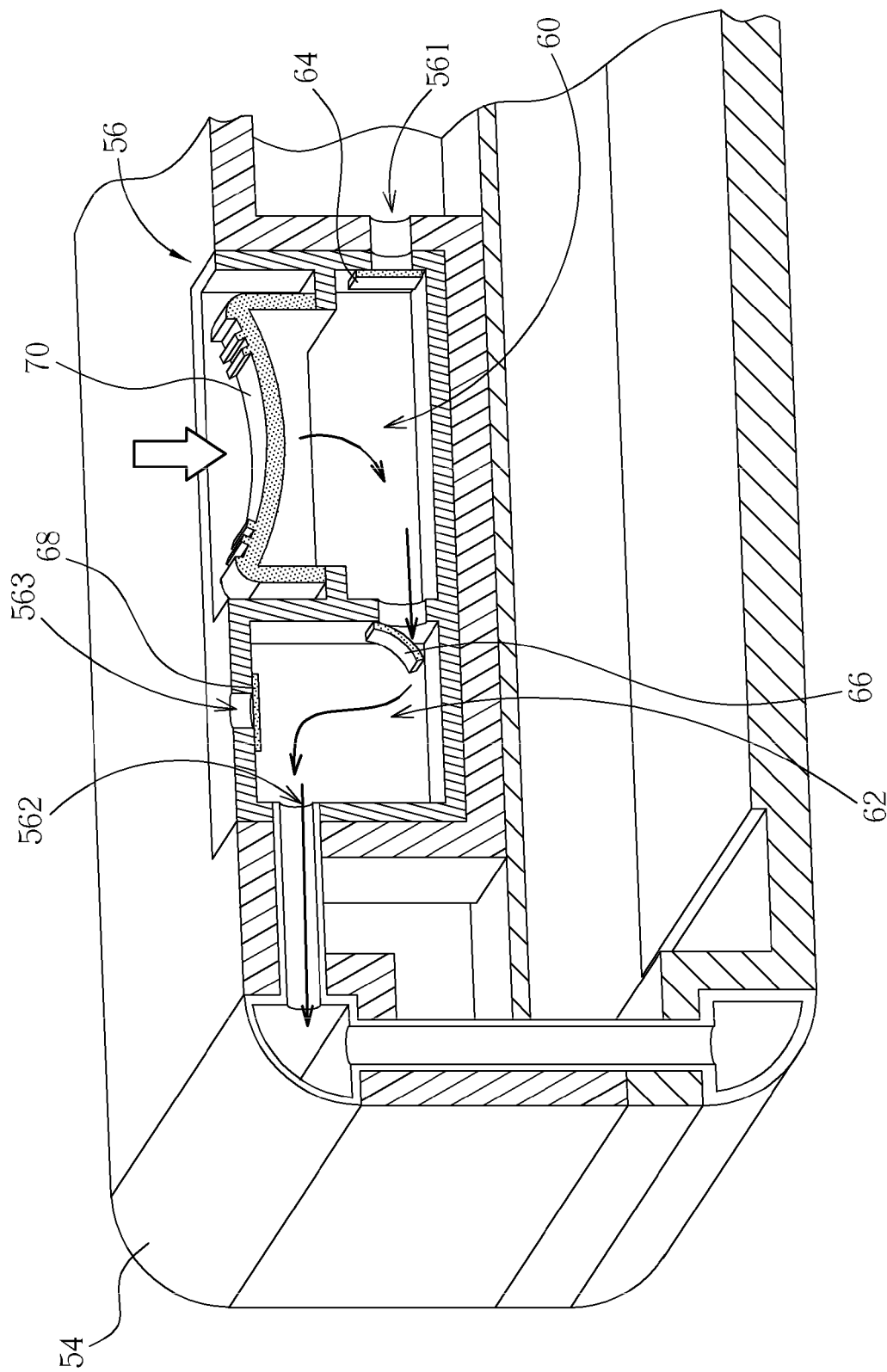
FIG. 10 is a diagram illustrating that the pressure module conducts air into the gasbag module according to the preferred embodiment of the present invention.
Figure 11:
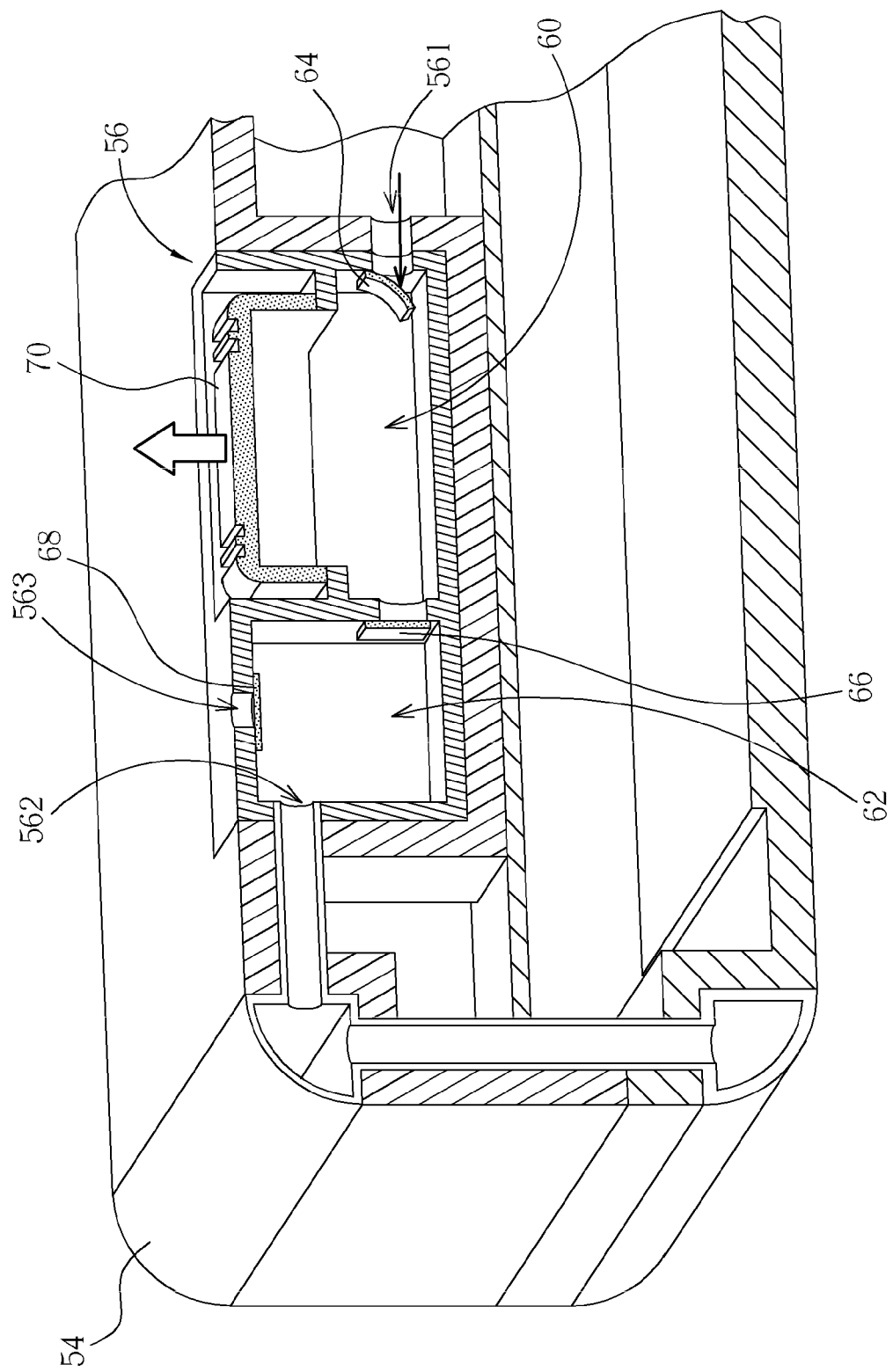
FIG. 11 is a diagram of external air flowing into the pressure module according to the preferred embodiment of the present invention.

Please refer to FIG. 8 to FIG. 11. FIG. 8 is a diagram of the pressure module 56 according to the preferred embodiment of the present invention. FIG. 9 is a sectional view of the gasbag module 54 and the pressure module 56 according to the preferred embodiment of the present invention. FIG. 10 is a diagram illustrating that the pressure module 56 conducts the air into the gasbag module 54 according to the preferred embodiment of the present invention. FIG. 11 is a diagram of external air flowing into the pressure module 56 according to the preferred embodiment of the present invention. An inhaling hole 561, a ventilation hole 562, and an exhausting hole 563 are formed on the pressure module 56. A first chamber 60 and a second chamber 62 are formed inside the pressure module 56. The first chamber 62 connects the outside of the gasbag module 54 via the inhaling hole 561, and the second chamber 62 connects the inside of the gasbag module 54 via the ventilation hole 562. The pressure module 56 further includes a first valve 64 disposed on a side of the first chamber 60 for controlling inhalation of the air outside the gasbag module 54 into the first chamber 60 via the inhaling hole 561, a second valve 66 disposed between the first chamber 60 and the second chamber 62 for controlling inhalation of air inside the first chamber 60 into the second chamber 62, and a third valve 68 disposed on a side of the second chamber 62 for controlling exhaustion of the air inside the second chamber 62 out of the gasbag module 54 via the exhausting hole 563. The first valve 64, the second valve 66, and the third valve 68 can be a check valve respectively. In this embodiment, the pressure module 56 includes a mechanism of two chambers and three valves. The amount and the disposition of the chambers and the valves of the pressure module 56 are not limited to the embodiment and depend on actual demand.

In addition, the pressure module 56 further includes a driving component 70 disposed on a side of the first chamber 60 for changing volume and internal pressure of the first chamber 60. The driving component 70 is a button according to this embodiment. The driving component 70 can be made of flexible material, such as rubber or silica gel material. The driving component 70 can be a piston instead. The present invention can utilize manual or automatic design to actuate the driving component 70, such as pressing the driving component 70 by hand or by electricity for changing volume and internal pressure of the first chamber 60 so as to drive the air inside the first chamber 60 to the inside of the gasbag module 54 via the second valve 66, the second chamber 62, and the ventilation hole 562.

Please refer to FIG. 10, when the driving component 70 is pressed so that the internal pressure of the first chamber 60 increases and the volume of the first chamber 60 reduces, the air inside the first chamber 60 can push the second valve 66 to flow into the inside of the gasbag module 54 via the second chamber 62 and the ventilation hole 562 for expanding the gasbag module 54. At this time, the first valve 64 is close accordingly so as to stop the air outside the gasbag module 54 from flowing into the first chamber 60. Please refer to FIG. 11, when the driving component 70 recovers from a pressed condition as shown in FIG. 10 so that the internal pressure of the first chamber 60 reduces and the volume of the first chamber 60 increases, the air inside the first chamber 60 can not push the second valve 66 and can not flow into the second chamber 62. At this time, the first valve 64 is open due to reduction of the internal pressure of the first chamber 60 for allowing the air outside the gasbag module 54 for flowing into the first chamber 60. The above-mentioned actions can be executed repeatedly for conducting more air to flow into the gasbag module 54 so as to expand the gasbag module 54. Besides, for recovering the unexpanded gasbag module 54 from the expanded gasbag module 54, the third valve 68 is pressed to open so that the air inside the gasbag module 54 can flow outside the gasbag module 54 via the second chamber 62 and the exhausting hole 563.

In contrast to the prior art, the portable electronic device of the present invention utilizes the expansible gasbag module to provide an effective impact-protection function. The mechanical design of the present invention also maintains aesthetic feeling and prevents interference with other components.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A portable electronic device comprising:
   a housing;
   a gasbag module installed on the housing in an expansible manner; and
   a pressure module connected to the gasbag module for conducting air outside the gasbag module into the gasbag module so as to expand the gasbag module.

2. The portable electronic device of claim 1 wherein the housing comprises:
   a front casing; and
   a back casing combined with the front casing.

3. The portable electronic device of claim 2 wherein the gasbag module comprises:
   a first gasbag installed on the front casing; and
   a second gasbag connected to the first gasbag and installed on the back casing.

4. The portable electronic device of claim 3 wherein the first gasbag and the second gasbag are disposed around the front casing and the back casing respectively.

5. The portable electronic device of claim 1 wherein the gasbag module is disposed around the housing.

6. The portable electronic device of claim 1 wherein a first chamber and a second chamber are formed inside the pressure module, the first chamber is for connecting the outside of the gasbag module, and the second chamber is for connecting the inside of the gasbag module.

7. The portable electronic device of claim 6 wherein the pressure module comprises:
   a first valve disposed on a side of the first chamber for controlling inhalation of the air outside the gasbag module into the first chamber;
   a second valve disposed between the first chamber and the second chamber for controlling inhalation of air inside the first chamber into the second chamber; and
   a third valve disposed on a side of the second chamber for controlling exhaustion of the air inside the second chamber out of the gasbag module.

8. The portable electronic device of claim 7 wherein the pressure module further comprises a driving component disposed on a side of the first chamber for changing volume of the first chamber so as to drive the air inside the first chamber to the inside of the gasbag module via the second valve and the second chamber.

9. The portable electronic device of claim 8 wherein the air inside the first chamber pushes the second valve so as to flow into the inside of the gasbag module via the second chamber when the driving component is pressed.

10. The portable electronic device of claim 9 wherein the first valve is close for stopping the air outside the gasbag module from flowing into the first chamber when the driving component is pressed.

11. The portable electronic device of claim 10 wherein the first valve is open for allowing the air outside the gasbag module for flowing into the first chamber when the driving component recovers from a pressed condition.

12. The portable electronic device of claim 8 wherein the driving component is a button.

13. The portable electronic device of claim 8 wherein the driving component is a piston.

14. The portable electronic device of claim 7 wherein air inside the gasbag module flows outside the gasbag module via the second chamber when the third valve is pressed to open.

15. The portable electronic device of claim 1 wherein the gasbag module is made of silica gel material.

* * * * *